United States Patent
Colombo

(12)
(10) Patent No.: US 6,367,267 B1
(45) Date of Patent: Apr. 9, 2002

(54) INTEGRATED PHASE SEPARATOR FOR ULTRA HIGH VACUUM SYSTEM

(75) Inventor: Paul E. Colombo, White Bear Lake, MN (US)

(73) Assignee: Applied EPI, Inc., St. Paul, MN (US)

( * ) Notice: Subject to any disclaimer, the term of this patent is extended or adjusted under 35 U.S.C. 154(b) by 0 days.

(21) Appl. No.: 09/668,772

(22) Filed: Sep. 22, 2000

(51) Int. Cl.$^7$ .............................. B01D 8/00; F17C 9/02
(52) U.S. Cl. ........................................ 62/55.5; 62/50.5
(58) Field of Search ................................ 62/55.5, 50.2, 62/50.5

(56) References Cited

U.S. PATENT DOCUMENTS

| | | | | |
|---|---|---|---|---|
| 3,292,383 A | * | 12/1966 | Charles et al. ................ | 62/55.5 |
| 3,371,499 A | * | 3/1968 | Hagenbach et al. .......... | 62/55.5 |
| 4,009,585 A | * | 3/1977 | Larin ........................... | 62/55.5 |
| 4,873,833 A | * | 10/1989 | Pfeiffer et al. ................ | 62/55.5 |
| 5,788,776 A | * | 8/1998 | Colombo ..................... | 118/688 |
| 5,951,767 A | * | 9/1999 | Colombo ..................... | 118/688 |

OTHER PUBLICATIONS

Declaration of Thomas E. Bird, including Exhibit A, dated Aug. 29, 2001.

* cited by examiner

Primary Examiner—William C. Doerrler
(74) Attorney, Agent, or Firm—Merchant & Gould P.C.

(57) ABSTRACT

An integrated phase separator for use in an ultra high vacuum system, for example, a molecular beam epitaxy system, is described. The vacuum chamber has a cryogenic panel disposed therein. The cryogenic panel includes a cryogenic shroud region and a phase separator region. Liquid nitrogen is introduced into the cryogenic panel via an inlet line. As the liquid nitrogen warms and vaporizes, nitrogen vapor rises within the shroud. The phase separator region within the cryogenic panel provides a near atmospheric pressure vapor barrier over the liquid nitrogen so that the nitrogen vapor may escape smoothly through the outlet of the panel, without forming gas bursts. Also, the phase separator region is vacuum jacketed to prevent cryogenic shroud surface temperature changes due to variations in liquid nitrogen levels, thereby increasing the cryogenic shroud's pumping stability.

11 Claims, 3 Drawing Sheets

INTEGRATED PHASE SEPARATOR FOR ULTRA HIGH VACUUM SYSTEM

BACKGROUND OF THE INVENTION

The present invention is directed to a phase separator for use in an ultra high vacuum system, for example, a molecular beam epitaxy ("MBE") system and, more particularly, to a phase separator integrated into a cryogenic reactor chamber within the MBE system that facilitates the smooth flow of liquid nitrogen into and gaseous nitrogen out of the system.

SUMMARY OF THE INVENTION

Ultra high vacuum systems are used in many manufacturing, scientific and other applications. Throughout this application, ultra high vacuum ("UHV") systems are defined as those having base system pressures less than approximately $10^{-8}$ Torr. One example of a system employing UHV is epitaxial crystal growth.

One such epitaxial crystal growth application employing UHV is molecular beam epitaxy ("MBE"). In MBE, thin films of material are deposited onto a substrate by directing molecular or atomic beams onto a substrate. Deposited atoms and molecules migrate to energetically preferred lattice positions on a heated substrate, yielding film growth of high crystalline quality and purity, and optimum thickness uniformity. MBE is widely used in compound semiconductor research and in the semiconductor device fabrication industry, for thin-film deposition of elemental semiconductors, metals and insulating layers.

Purity of the growing films depends critically on the operating pressure of the growth chamber and the residual gas composition. To ensure the high level of purity required, for example, by the semiconductor industry, the MBE growth chamber base pressure is necessarily in the ultra high vacuum range (UHV), typically less than $10^{-10}$ Torr.

Furthermore, film growth rates, film composition and film doping levels depend critically on the operating temperature of numerous critical components of the growth system, for example, the source cells and the substrate carrier. To this end, MBE growth chambers often employ a liquid nitrogen filled cryogenically cooled shroud ("cryo-shroud") surrounding interior elements and enclosing the active growth region. This cryo-shroud serves a multiplicity of purposes: 1) to enhance the level of vacuum in the UHV chamber by condensing volatile residual species not removed or trapped by the vacuum pumping system i.e. providing a cryopumping action, 2) to enhance the thermal stability and temperature control of critical growth reactor components, and 3) to condense and trap source material emitted from the effusion cells but not incorporated into the growing film.

The implementation of a liquid nitrogen filled cryo-shroud in an UHV system requires a phase separator that allows the escape of gaseous nitrogen generated by the vaporization of the liquid nitrogen as heat is absorbed by the cryo-shroud. The phase separator also enables a replenishing feed of liquid nitrogen into the cryo-shroud to maintain the desired operating temperature. A conventional implementation of such an external phase separator is shown in FIG. 1.

As shown in FIG. 1, vacuum chamber 100 contains a cryogenic shroud 110 having a liquid nitrogen inlet 112 and a liquid nitrogen outlet 114. A phase separator 120 is connected to inlet and outlet 112, 114 via ports 132, 134 and lines 122, 124, respectively. Liquid nitrogen at or below its atmospheric boiling point of 77.5° K. (−195.5° C.) is introduced into phase separator 120 via inlet 142 and flows through port 132 and line 122 and enters cryo-shroud 110 via inlet 112. As nitrogen in cryo-shroud 110 warms to the boiling point due to heat absorbed from vacuum chamber 100, vapor forms within the body of the liquid and bubbles rise by gravity to the top of the cryo-shroud and ultimately out through outlet 114, liquid-filled exhaust line 124, port 134 and gaseous nitrogen escapes via exhaust 144. The formation and flow of these vapor bubbles result in the turbulence and seething normally associated with boiling action, causing mixing effects with the liquid-state nitrogen and counteracting the natural tendency for colder, more dense liquid to settle into the lower portion of the cryo-shroud.

Several problems are associated with a conventional phase separator design. First, the small cross-sectional area of the exhaust line results in a flow restriction for the vapor bubbles and formation of a "frothing", boiling region in the upper section of the cryo-panel. This region will be elevated in temperature above the liquid nitrogen boiling point, resulting in poor heat absorption from the adjacent cryo-shroud surface. Second, large pockets of gas can accumulate within the body of the cryo-shroud before ultimately breaking loose and flowing to the exhaust line, giving rise to local, temporary warming of the cryo-shroud surface at the location of the trapped gas pocket. Third, the configuration results in an operating pressure within the cryo-shroud considerably above atmospheric pressure. This causes an elevation of the liquid nitrogen boiling point and an overall rise in the operating temperature of the cryo-shroud. A temperature rise of even a few degrees can significantly degrade the cryo-pumping performance of the cryo-shroud. For example, the vapor pressure of carbon dioxide ($CO_2$) increases exponentially with temperature from $10^{-9}$ Torr at 72.1° K. to $10^{-7}$ Torr at 80.6° K. The limited surface area of the gas-to-liquid interface in the exhaust line enhances these problems.

The present invention overcomes the above-difficulties by integrating both the phase separator and the cryo-panel within the vacuum chamber, thus eliminating the lines of relatively small diameter connecting the vacuum chamber to an external phase separator. According to the present invention, a cryogenic panel disposed within a vacuum chamber, e.g., an MBE reaction chamber, includes a cryogenic shroud region and a phase separator region. Liquid nitrogen is introduced into the cryogenic panel via an inlet line. As the liquid nitrogen warms and vaporizes, nitrogen vapor rises within the shroud. The phase separator region within the cryogenic panel provides a large area vapor-to-liquid interface held at near atmospheric pressure, ensuring that nitrogen vapor may escape the panel smoothly, without forming gas bursts, and with minimal turbulence and general disturbance of the liquid reservoir.

The upper end of the cryogenic panel containing the phase separator region preferably is vacuum jacketed. The liquid nitrogen feed mechanism is designed such that the liquid-to-vapor phase boundary is always held at a level within the region encompassed by the vacuum jacket. This prevents exposed external surfaces of the cryo-shroud from varying in temperature from the nominal 77.4° K. associated with the internal liquid nitrogen bath, thereby optimizing its performance and thermal stability.

The flow of liquid nitrogen into the cryogenic panel will generally be intermittent, gated by a level sensor located within the phase separator and a fill mechanism. Following a significant time period of no flow, the feed lines will have warmed considerably and liquid nitrogen may vaporize initially as it flows from the bulk supply tank to the cryogenic panel. This can give rise to high velocity gas injection into the phase separator region and mixing effects between the vapor and liquid phases, until the delivery line has sufficiently cooled. Normal flow of liquid nitrogen into the system can have similar, although less severe, effects. Terminating the inlet line in a "shower head" arrangement that disperses the gas or liquid flow and directs it in a generally horizontal direction can minimize turbulence in the liquid nitrogen reservoir, and general disturbance of the vapor/liquid interface.

DETAILED DESCRIPTION OF THE PREFERRED EMBODIMENTS

An integrated phase separator for an UHV system according to the present invention is shown in FIGS. 2 through 5. Throughout the drawings, like numerals are used to indicate like elements.

Figure 1:
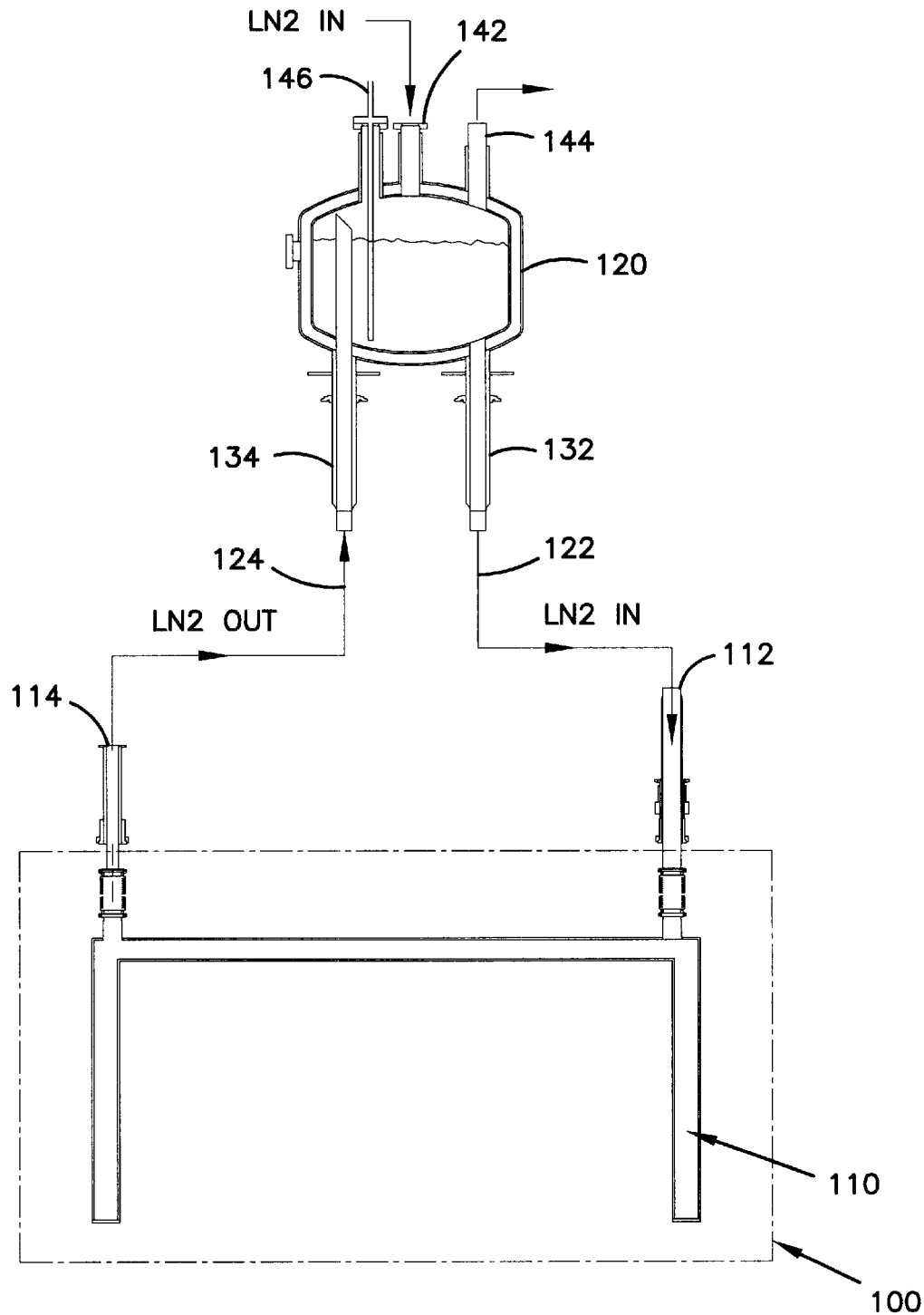
FIG. 1 is a cross-sectional view of an UHV system showing a conventional phase separator.
Figure 2:
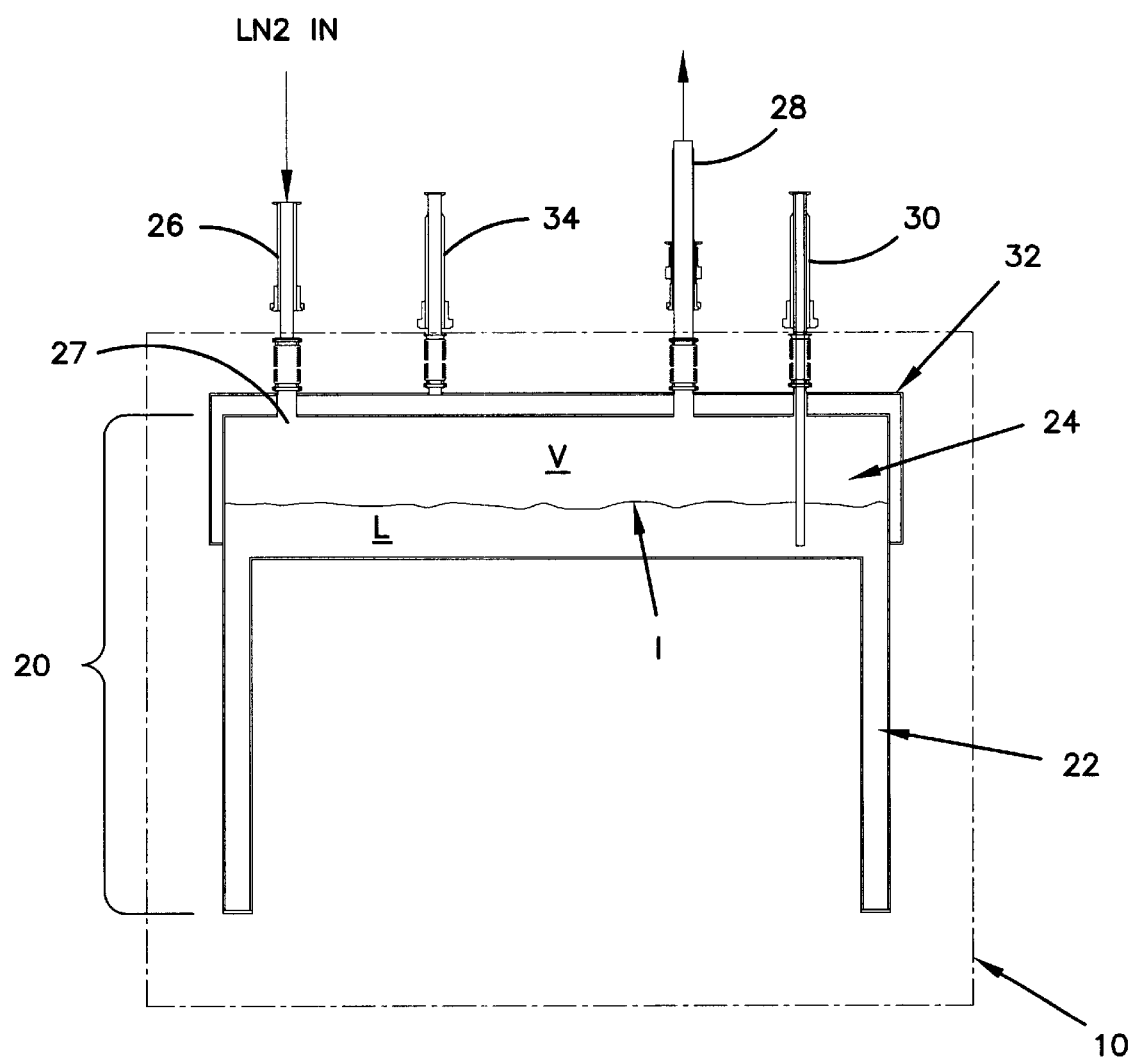
FIG. 2 is a cross-sectional view of a first preferred embodiment of the invention showing an UHV system having an integrated phase separator.

As shown in FIG. 2, the UHV system includes vacuum chamber 10 with cryo-panel 20 disposed within the chamber. Cryo-panel 20 includes cryo-shroud region 22 and phase separator region 24. Liquid nitrogen at a temperature equal to or below its boiling point of 77° K. is introduced into the cryo-panel through input port 26 and fill head 27. It is to be understood that input port 26 is connected to a liquid nitrogen supply (not shown) and a fill mechanism (also, not shown).

As the liquid nitrogen warms in cryogenic shroud region 22 and vaporizes, the gaseous nitrogen rises into phase separator region 24. Phase separator region 24 provides a vapor-to-liquid interface layer "I" held at near atmospheric pressure. Interface "I" has a large surface area substantially equal to the cross-sectional area of cryo-panel 20. The vapor side "V" of interface "I" is coupled essentially directly to exhaust 28. Interface "I" ensures that the nitrogen vapor may escape the panel smoothly via outlet port 28, causing minimal turbulence and without forming gas bursts or frothing, as occurs in prior art external phase separators.

A level sensor 30 preferably is provided to facilitate maintenance of the desired level of liquid nitrogen within the cryopanel. Level sensor 30 is coupled operatively to the liquid side "L" of interface "I" and provides a measurable signal indicating the present level of the interface "I".

Vacuum jacket 32 preferably is disposed around the upper end of cryo-panel 20 so that at least the phase separator region 24, and particularly interface "I", is enclosed therein. Vacuum port 34 is connected to a vacuum pump (not shown). Enclosing interface "I" within vacuum jacket 32 prevents the external surfaces of cryo-shroud region 22 from varying significantly from the nominal 77° K. of the internal liquid nitrogen bath, thus optimizing thermal stability and performance. It is envisioned that vacuum jacket 32 may be constructed of several pieces. In this case, it may be desirable to install stabilizers, such as welded rods, to ensure structural rigidity despite extreme temperature variations resulting from cool-down and subsequent return to ambient cycles that occur during normal usage.

Figure 5:
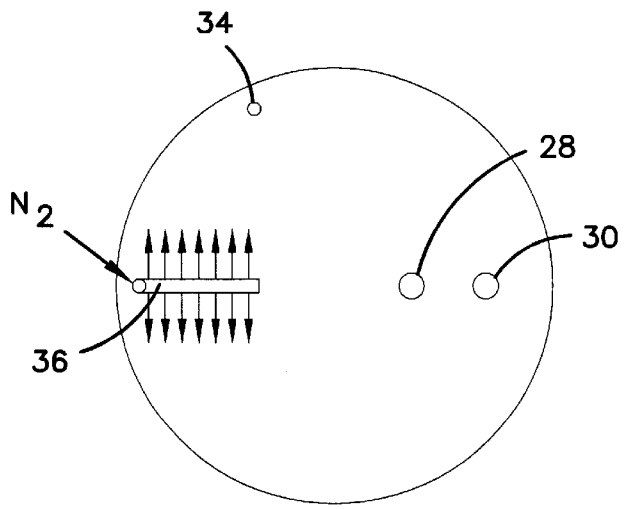
FIG. 5 is a planar top view of the invention as shown in FIG. 3.
Figure 4:
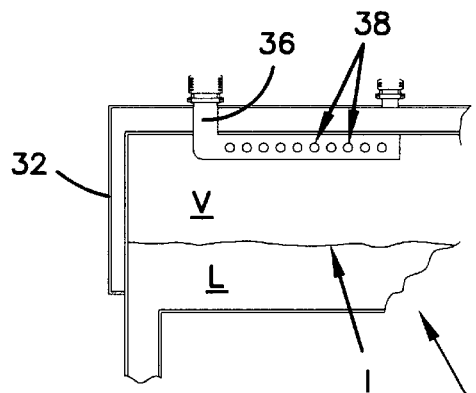
FIG. 4 is a cross-sectional view of a portion of FIG. 3 showing the "shower head" feature.
Figure 3:
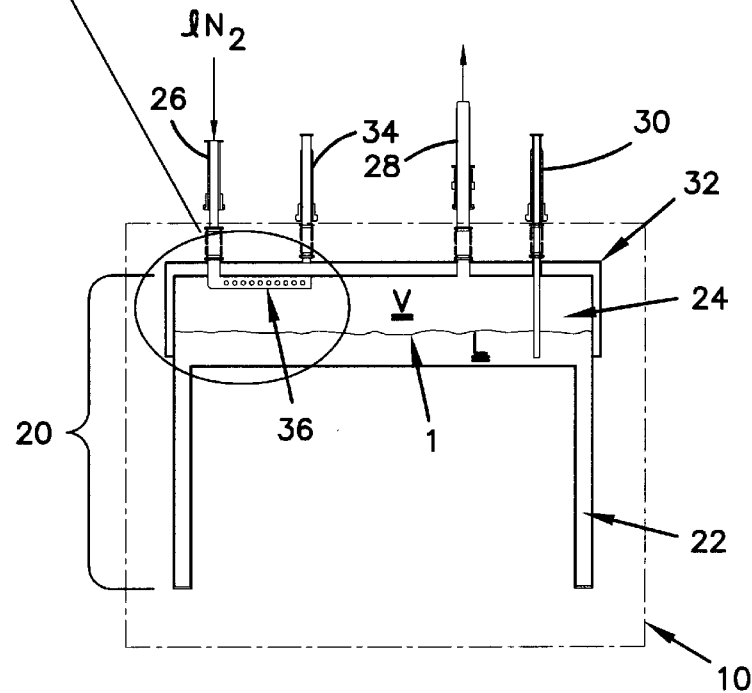
FIG. 3 is a cross-sectional view of another preferred embodiment of the present invention showing the "shower head" feature.

A further embodiment of the integrated phase separator according to the present invention is shown in FIGS. 3–5. In this embodiment, liquid nitrogen fill head 27 is replaced with liquid nitrogen "shower" fill head 36. As shown particularly in FIG. 4, shower fill head 36 includes a plurality of fluid exit apertures 38 through which liquid nitrogen is introduced into cryo-panel 20. This arrangement disperses the liquid nitrogen in a generally horizontal direction, as shown in FIG. 5, which minimizes disturbance of interface "I" and turbulence in the liquid nitrogen reservoir (the liquid side "L" of interface "I").

As mentioned above, one example of an UHV system wherein the present invention is particularly useful is molecular beam epitaxy ("MBE"). In this case, vacuum chamber 10 is a MBE system reaction chamber. Other examples wherein an integrated phase separator according to the invention may be deployed include surface analysis instruments, such as Auger Electron Spectrometry ("AES"), Dynamic Secondary Ion Mass Spectrometry ("DSIMS") and Low Energy Electron Diffraction ("LEED") microscopes wherein UHV is required to minimize sample surface contamination. Of course, it is to be understood that these examples are illustrative only and other systems and environments may benefit from the use of the present invention.

The above is for illustrative purposes only. Modifications may be made, particularly with regard to size, shape and arrangement of elements, within the scope of the invention as defined by the appended claims.

I claim:

1. An integrated phase separator device for an ultra high vacuum system, said system being adapted to deposit a thin film of material on a substrate, said device comprising:
    a. a vacuum chamber; and
    b. a cryogenic panel disposed within said vacuum chamber, said cryogenic panel having a liquid nitrogen input port and a nitrogen vapor outlet port, wherein said cryogenic panel provides a near atmospheric pressure vapor barrier over the liquid nitrogen so that the nitrogen vapor may escape smoothly through said outlet port, and wherein said cryogenic panel includes a cryogenic shroud region and a phase separator region, said cryogenic shroud region at least partially surrounding a substrate to be coated in said vacuum chamber, said near atmospheric pressure vapor barrier being disposed within said phase separator region.

2. An integrated phase separator device as in claim 1, further comprising a vacuum jacket disposed within said vacuum chamber and surrounding said near atmospheric pressure vapor barrier within said phase separator region.

3. An integrated phase separator device as in claim 2, wherein said vacuum chamber is a reaction chamber of a molecular beam epitaxy system.

4. An integrated phase separator device for a molecular beam epitaxy system, said device comprising:
    a. a reaction chamber;
    b. a cryogenic panel disposed within said reaction chamber, said cryogenic panel having a cryogenic shroud region and a phase separator region, said phase separator region containing a vapor-to-liquid interface having a surface area substantially equal to a cross-sectional area of said cryogenic panel c. means for intermittently introducing liquid nitrogen into said cryogenic panel;

d. an exhaust through which nitrogen vapor exits said cryogenic panel; and e. a vacuum jacket surrounding said phase separator region containing said vapor-to-liquid interface.

5. An integrated phase separator as in claim 4, wherein said means for intermittently introducing liquid nitrogen into said cryogenic panel includes a level sensor for sensing the level of liquid nitrogen in a liquid side of said vapor-to-liquid interface.

6. An integrated phase separator as in claim 4, wherein said vapor-to-liquid interface is maintained at substantially atmospheric pressure.

7. An integrated phase separator as in claim 4, wherein said cryogenic shroud region at least partially surrounds a substrate to be coated in the molecular beam epitaxy system.

8. An integrated phase separator device for a molecular beam epitaxy system, said device comprising:

a. a reaction chamber;

b. a cryogenic panel disposed within said reaction chamber, said cryogenic panel having a cryogenic shroud region and a phase separator region, said phase separator region containing a vapor-to-liquid interface having a surface area substantially equal to a cross-sectional area of said cryogenic panel;

c. means for intermittently introducing liquid nitrogen into said cryogenic panel, said means for intermittently introducing liquid nitrogen including a liquid nitrogen inlet port disposed in said cryogenic panel and a fill head coupled to said inlet port, said fill head containing a plurality of holes disposed therein, wherein the liquid nitrogen is dispersed in a direction substantially horizontally from said fill head;

d. an exhaust through which nitrogen vapor exits said cryogenic panel; and e. a vacuum jacket surrounding said phase separator region containing said vapor-to-liquid interface.

9. An integrated phase separator as in claim 8, wherein said means for intermittently introducing liquid nitrogen into said cryogenic panel further includes a level sensor for sensing the level of liquid nitrogen in a liquid side of said vapor-to-liquid interface.

10. An integrated phase separator as in claim 8, wherein said vapor-to-liquid interface is maintained at substantially atmospheric pressure.

11. An integrated phase separator as in claim 8, wherein said cryogenic shroud region at least partially surrounds a substrate to be coated in the molecular beam epitaxy system.

* * * * *

UNITED STATES PATENT AND TRADEMARK OFFICE
CERTIFICATE OF CORRECTION

PATENT NO.     : 6,367,267 B1                                                    Page 1 of 1
DATED          : April 9, 2002
INVENTOR(S)    : Colombo It is certified that error appears in the above-identified patent and that said Letters Patent is hereby corrected as shown below:

Title page,
Illustrative figure, the Figure 3 designation of the vapor-to-liquid interface layer should be -- I -- instead of the originally depicted number "1".

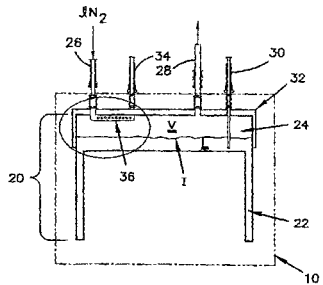

Drawings,
Sheet 3 of 3 (Figures), the Figure 3 designation of the vapor-to-liquid interface layer should be -- I -- instead of the originally depicted number "1".

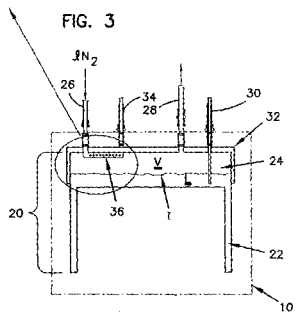

Signed and Sealed this

Fourteenth Day of September, 2004

JON W. DUDAS
*Director of the United States Patent and Trademark Office*